(12) United States Patent  (10) Patent No.: US 7,486,103 B2
Shiu et al.  (45) Date of Patent: Feb. 3, 2009

(54) SWITCHING SYSTEM CAPABLE OF REDUCING NOISE OF OUTPUT SIGNAL

(75) Inventors: Shian-Sung Shiu, Taipei (TW); Chung-Che Yu, Taipei (TW); Kuo-Wei Peng, Taipei (TW)

(73) Assignee: Young Lighting Technology Corporation, Hsinchu (TW)

( * ) Notice: Subject to any disclaimer, the term of this patent is extended or adjusted under 35 U.S.C. 154(b) by 0 days.

(21) Appl. No.: 11/734,423

(22) Filed: Apr. 12, 2007

(65) Prior Publication Data

US 2008/0151118 A1   Jun. 26, 2008

(30) Foreign Application Priority Data

Dec. 20, 2006   (TW) .............................. 95147912 A (51) Int. Cl.
*H03K 17/16* (2006.01)
(52) U.S. Cl. .................. 326/26; 326/115; 326/127; 327/63; 327/387; 327/391
(58) Field of Classification Search ................. 326/115, 326/127, 26, 27; 327/63, 387, 391; 341/136, 341/144
See application file for complete search history.

(56) References Cited

U.S. PATENT DOCUMENTS

| 5,397,943 | A | * | 3/1995 | West et al. ..................... 326/39 |
| 5,703,519 | A | * | 12/1997 | Crook et al. ................. 327/387 |
| 5,977,800 | A | * | 11/1999 | Iravani ....................... 326/115 |
| 6,300,804 | B1 | * | 10/2001 | Vadipour ..................... 327/63 |
| 6,340,939 | B1 | * | 1/2002 | Dedic .......................... 341/136 |
| 6,603,348 | B1 | * | 8/2003 | Preuss et al. ................. 327/563 |
| 6,795,008 | B1 | | 9/2004 | Wang |
| 6,914,455 | B2 | * | 7/2005 | Yoshida et al. ................. 327/65 |
| 6,943,718 | B2 | | 9/2005 | Wang |

* cited by examiner

*Primary Examiner*—Vibol Tan
(74) *Attorney, Agent, or Firm*—J.C. Patents (57) ABSTRACT

A switching system capable of reducing the noise of the output signal is provided. The switching system includes a first switch and a second switch, wherein the first switch conducts a first signal according to a first control signal; the second switch conducts a second signal according to a second control signal. And the voltages of the first control signal and the second control signal are restricted within a voltage interval to reduce the noise produced during the switching of the switches.

19 Claims, 5 Drawing Sheets

SWITCHING SYSTEM CAPABLE OF REDUCING NOISE OF OUTPUT SIGNAL

CROSS-REFERENCE TO RELATED APPLICATION

This application claims the priority benefit of Taiwan application serial no. 95147912, filed Dec. 20, 2006. All disclosure of the Taiwan application is incorporated herein by reference.

BACKGROUND OF THE INVENTION

1. Field of the Invention

The present invention generally relates to a switching system, and more particularly, to a switching system capable of reducing the noise of output signal.

2. Description of Related Art

Clock feedthrough interference is commonly occurring noise interference in a circuit when a signal switched by a metal oxide semiconductor (MOS) transistor. The clock feedthrough would cause glitches which leads to a wrong judgment of the related circuit or the downward stability of the signal. For a high-frequency digital signal, due to more frequent switching operations, the negative impact of the glitch interference on a signal becomes more significant.

In particular, in a current mode digital to analog converter (current mode DAC), a number of switches are employed to switch current paths. When numerous switches are used to simultaneously switch various signals, a clock feedthrough and a glitch interference would greatly affect the output of the current mode DAC. If such a current mode DAC is used in a driving circuit of a LCD apparatus, the quality of an output frame would be degraded.

SUMMARY OF THE INVENTION

Accordingly, the present invention is directed to provide a switching system capable of restricting the voltage swing of the control signals of the switches according to the operation voltage interval of the switching system, and thereby reduce the noise produced during switching.

To achieve the above-mentioned or other aspects, the present invention provides a switching system, which includes a first switch and a second switch. The first switch is adapted for conducting a first signal according to a first control signal, and the second switch is adapted for conducting a second signal according to a second control signal. The voltages of the first control signal and the second control signal are restricted within a first voltage interval to reduce the noise produced by the switches during switching.

In another embodiment of the present invention, the above-mentioned switching system includes a current source for providing the first signal and the second signal by means of shunting. The switching system is biased within a second voltage interval and the first voltage interval is defined according to the second voltage interval.

In another embodiment of the present invention, the switching system further includes a driving unit for receiving a third signal and a fourth signal, and the driving unit respectively produces the first control signal and the second control signal according to the third signal and the fourth signal, wherein the driving unit can be operated under a first bias voltage or a second bias voltage, and the first bias voltage is less than the second bias voltage.

In another embodiment of the present invention, the driving unit further includes a first driving circuit and a second driving circuit, wherein the first driving circuit outputs the first control signal according to the third signal, and the second driving circuit outputs the second control signal according to the fourth signal.

In another embodiment of the present invention, the first driving circuit includes a third switch and a fourth switch, wherein the third switch and the fourth switch are biased between a first voltage and a second voltage, and the voltage level of the output terminal of the third switch, i.e. the voltage level of the first control signal, is decided by the third signal. The second driving circuit includes a fifth switch and a sixth switch, wherein the fifth switch and the sixth switch are biased between the first voltage and the second voltage, and the output voltage level of the fifth switch, i.e. the voltage level of the second control signal, is decided by the fourth signal.

The present invention is able to restrict the voltage swing of the control signals according to the operation voltage interval of the switching system. Therefore, the noise produced by the switches at switching can be reduced. In particular during switching signals, the influence of the glitch interference and the clock feedthrough interference on the output signal can be suppressed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
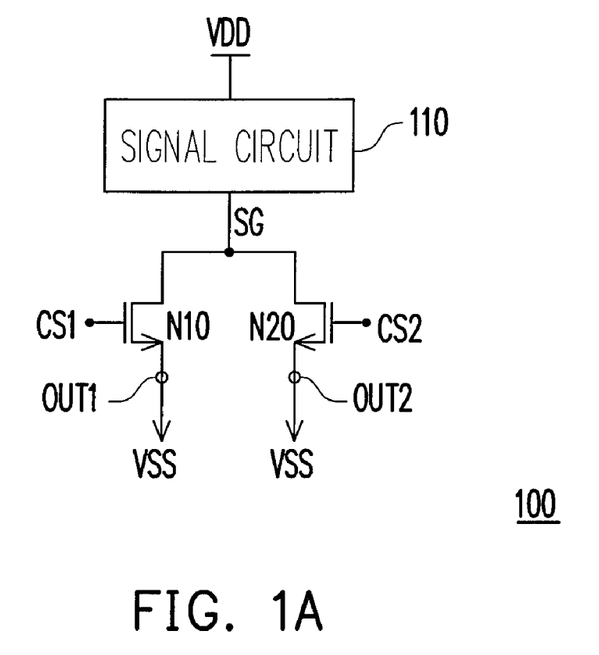
FIG. 1A is a schematic circuit diagram of a switching system according to an embodiment of the present invention.

FIG. 1A is a schematic circuit diagram of a switching system according to an embodiment of the present invention. The switching system is suitable for converting current in a current mode DAC. The switching system 100 includes a signal circuit 110 and NMOS transistors N10 and N20, wherein the NMOS transistors N10 and N20 are comprised of, for example, N-type transistors and the signal circuit 110 is adapted for providing a signal SG. The NMOS transistor N10 is coupled between the first output terminal OUT1 of the switching system 100 and the signal SG, and the control terminal (gate) of the NMOS transistor N10 is coupled to a first control signal CS1. The NMOS transistor N20 is coupled between the second output terminal OUT2 of the switching system 100 and the signal SG, and the control terminal (gate) of the NMOS transistor N20 is coupled to a second control signal CS2. The first control signal CS1 and the second control signal CS2 are phase-inverted to each other. The NMOS transistors N10 and N20 serve as switches to switch the output path of the signal SG. The signal SG can be current signal or voltage signal.

The switching system 200 switches the output path of the signal SG by using the first control signal CS1 and the second control signal CS2, wherein as the first control signal CS1 makes the NMOS transistor N10 enabled, the signal SG is output from the first output terminal OUT1. As the second control signal CS2 makes the NMOS transistor N20 enabled, the signal SG is output from the second output terminal OUT2 and during switching, the voltage swing of the first control signal CS1 and the second control signal CS2 fall into the operation voltage interval of the switching system 100.

In the present embodiment, the switching system is coupled between the voltages VDD and VSS, that is to say that the voltage swing of the first control signal CS1 and the second control signal CS2 are between the voltages VDD and VSS. In other words, the voltage swing of the first control signal CS1 and the second control signal CS2 are narrowed so as to reduce the noise produced during the switching of the transistors N10 and N20, wherein the noise source includes glitch interference and clock feedthrough interference and the noise would affect the signal/noise ratio (S/N ratio) of the output signal. In another embodiment of the present invention, if the switching system 100 is operated between the voltage VDD and the ground level, the voltage interval thereof is just between the voltage VDD and the ground level.

In the embodiment, the first control signal CS1 and the second control signal CS2 are restricted within a first voltage interval, while the switching system is biased within a second voltage interval, wherein the first voltage interval falls into the second voltage interval.

The number of the switches for switching signals is not limited by the present embodiment. In another embodiment of the present invention, the signals can be coupled to a single switch or simultaneously coupled to a plurality of switches. The major requirement of the present invention is the voltage swing of the control signals received by the switches must be controlled within an interval regardless of a single switch or a plurality of switches. Once this requirement is satisfied, the noise produced during the switching of the switches, for example a glitch interference and a clock feedthrough interference, may be reduced. The voltage swing of the control signals must be controlled within the operation voltage interval of the switching system to avoid an extreme-high or an extreme-low voltage. The control signals herein are retained to be at a sufficient level to turn the switches on/off. Thus, the voltage swing of a control signal herein can be adjusted according to different needs of the switching system (for example, the range of leakage current, the operation frequency and the operation voltage interval). If the voltage swing of the control signal is less, the influences of the glitch interference and the clock feedthrough interference on the switching system and the noise produced by the switches are less as well.

Figure 1B:
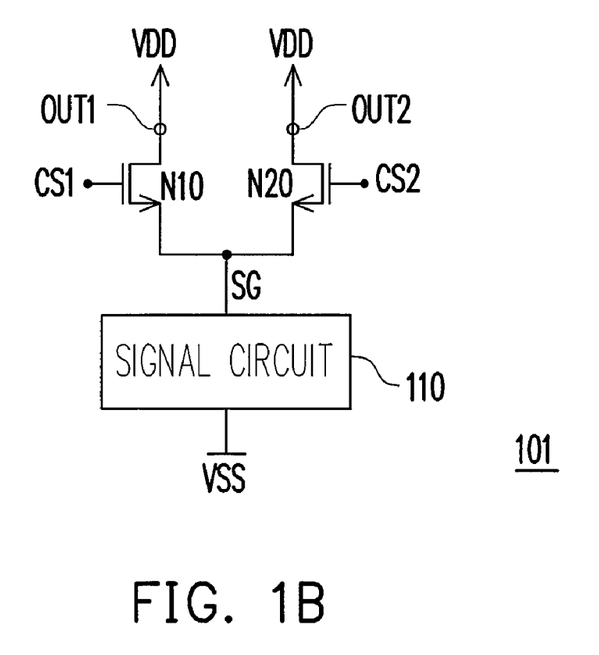
FIG. 1B is a schematic circuit diagram of another switching system according to an embodiment of the present invention.

FIG. 1B is a schematic circuit diagram of another switching system according to an embodiment of the present invention. The switching system of the present embodiment is similar to the switching system in FIG. 1A except the disposition of the the signal circuit 110 The NMOS transistors N10 and N20 are adapted for switching the path of the signal SG according to the first control signal CS1 and the second control signal CS2. The voltage swing of the first control signal CS1 and the second control signal CS2 fall into the operation voltage interval of the switching system 101 (the interval is between the voltages VDD and VSS). In another embodiment of the present invention, the above-mentioned switches are not limited by the NMOS transistors N10 and N20, instead, they can be implemented by other devices; for example, PMOS transistors.

Figure 2A:
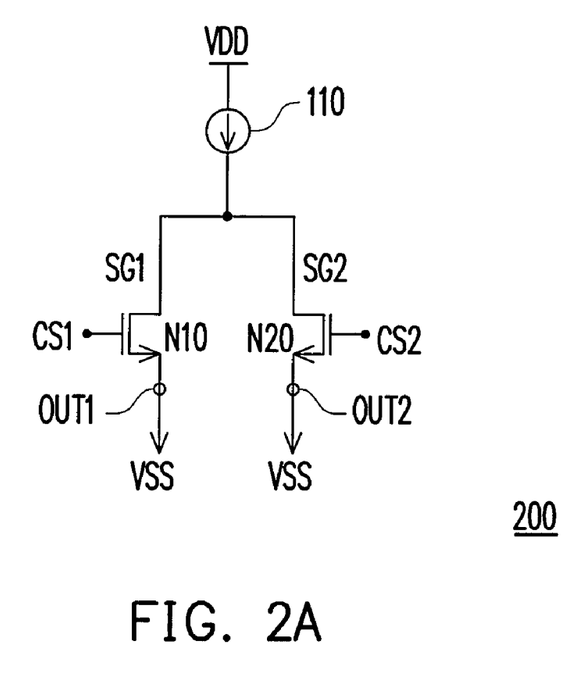
FIG. 2A is a schematic circuit diagram of a switching system according to another embodiment of the present invention.

In the following, the related circuit is further explained to describe the scheme of the present invention. FIG. 2A is a schematic circuit diagram of a switching system according to another embodiment of the present invention. Referring to FIG. 1A, if the signal circuit 110 in FIG. 1A is a current source (hereinafter termed as the current source 110), the circuit architecture is represented by FIG. 2A. The switching system 200 herein includes NMOS transistors N10 and N20 and a current source 110, wherein the current source 110 provides a signal SG1 and a signal SG2 by means of shunting, while the NMOS transistors N10 and N20 are respectively coupled between the signal SG1 and a voltage VSS and between the signal SG2 and the voltage VSS and switch the output paths of the signals SG1 and SG2 according to the first control signal CS1 and the second control signal CS2. When the first control signal CS1 is enabled, the signal SG1 is output from a first output terminal OUT1, when the second control signal CS2 is enabled, the signal SG2 is output from a second output terminal OUT2. During switching, the voltages of the first control signal CS1 and the second control signal CS2 are restricted to fall into the operation voltage interval of the switching system 200. The voltages of the first control signal CS1 and the second control signal CS2 could fall on the boundary of the interval.

Figure 2B:
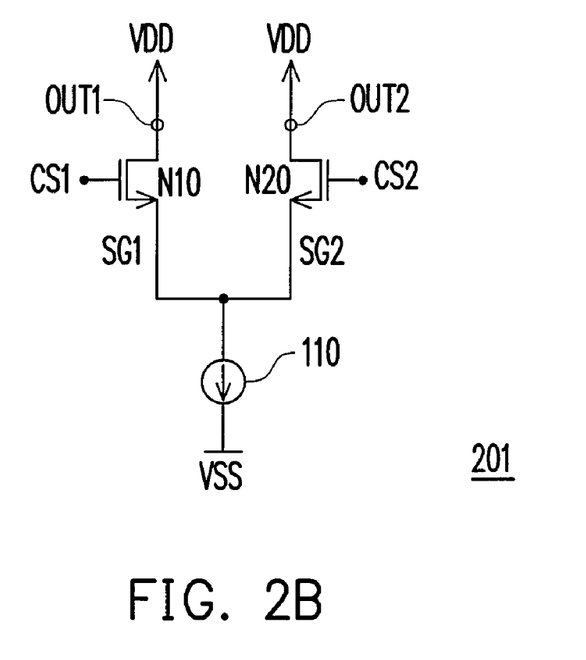
FIG. 2B is a schematic circuit diagram of a switching system according to another embodiment of the present invention.
Figure 3A:
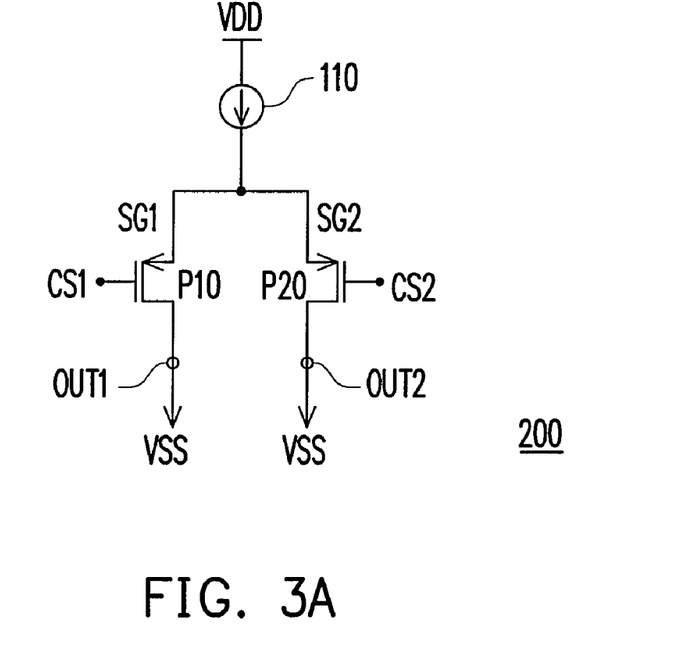
FIG. 3A is a schematic circuit diagram of a switching system according to another embodiment of the present invention.
Figure 3B:
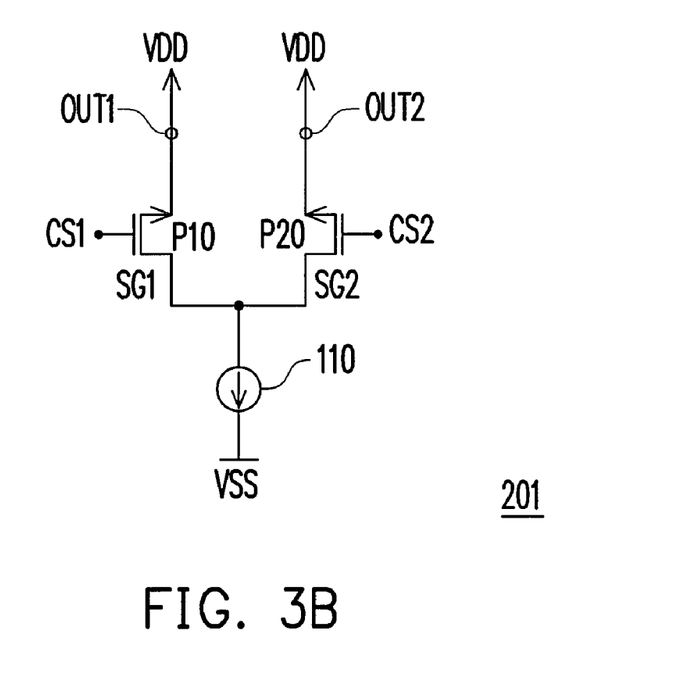
FIG. 3B is a schematic circuit diagram of a switching system according to another embodiment of the present invention. 1

In other embodiments of the present invention, the above-mentioned current source 110 can be disposed at other locations by design, as shown by FIG. 2B, and the switches can be replaced by PMOS transistors as shown by FIGS. 3A and 3B. The operation details of the FIGS. 2B, 3A and 3B can be referred to description with reference to FIGS. 1A-2A. Those skilled in the art would be able to derive the circuit operations from the above disclosure of the present invention without any difficulty, hence it is omitted herein.

Figure 4A:
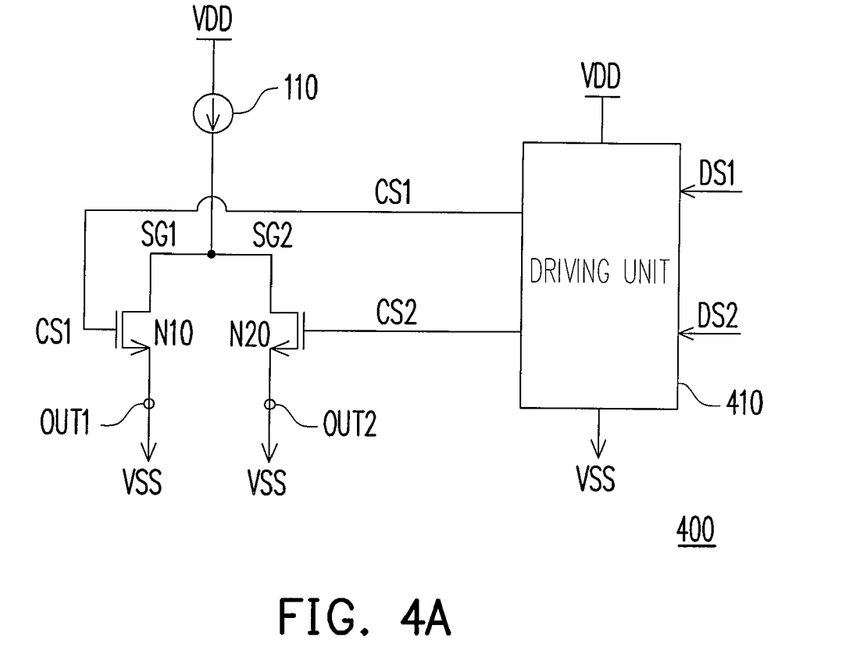
FIG. 4A is a schematic circuit diagram of a switching system according to another embodiment of the present invention.

FIG. 4A is a schematic circuit diagram of a switching system according to another embodiment of the present invention. The switching system of the present embodiment is similar to the switching system shown in FIG. 2A except for an internal driving unit 410 employed to convert digital signals DS1 and DS2 into a control signal CS1 and a control signal CS2, respectively. The driving unit 410 is operated between voltages VDD and VSS. Since the switching system 400 is able to change the output paths of the signals SG1 and SG2 (a first output terminal OUT1 or a second output terminal OUT2) according to the external digital signals DS1 and DS2, hence, when the voltage of the digital signals DS1 and DS2 fall outside the operation voltage interval of the switching system 400 or fall on the boundary of the interval, the switching system 400 would use the driving unit 410 to convert the digital signals DS1 and DS2 into a the first control signal CS1 and a second control signal CS2, both of which have an appropriate voltage swing. In the present embodiment, the voltage swing of the first control signal CS1 and the second control signal CS2 fall inside the voltage swing of the digital signals DS1 and DS2.

Figure 4B:
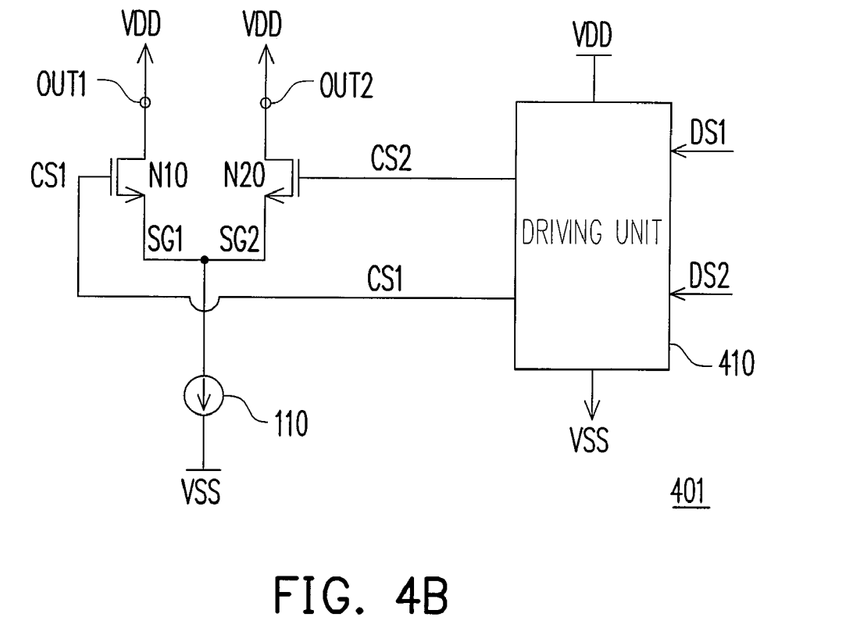
FIG. 4B is a schematic circuit diagram of a switching system according to another embodiment of the present invention.

In other words, if the logic-high levels of the digital signals DS1 and DS2 are equal to the voltage VDD and the logic-low levels thereof are equal to the voltage VSS, the operation voltage intervals of the first control signal CS1 and the second control signal CS2 are between the voltages VDD and VSS so as to reduce the noise produced by the transistors N10 and N20 during switching (turning on and off). In this way, when the signals SG1 and SG2 are output to the output terminal OUT1 or the output terminal OUT2, the noise influence caused by the glitch interference and the clock feedthrough interference can be reduced. In addition, the driving unit 410 is suitable for the circuit architectures of FIGS. 2B-3B as well. FIG. 4B is described for the exemplary purpose only, while the rest of the description is omitted herein.

Figure 5:
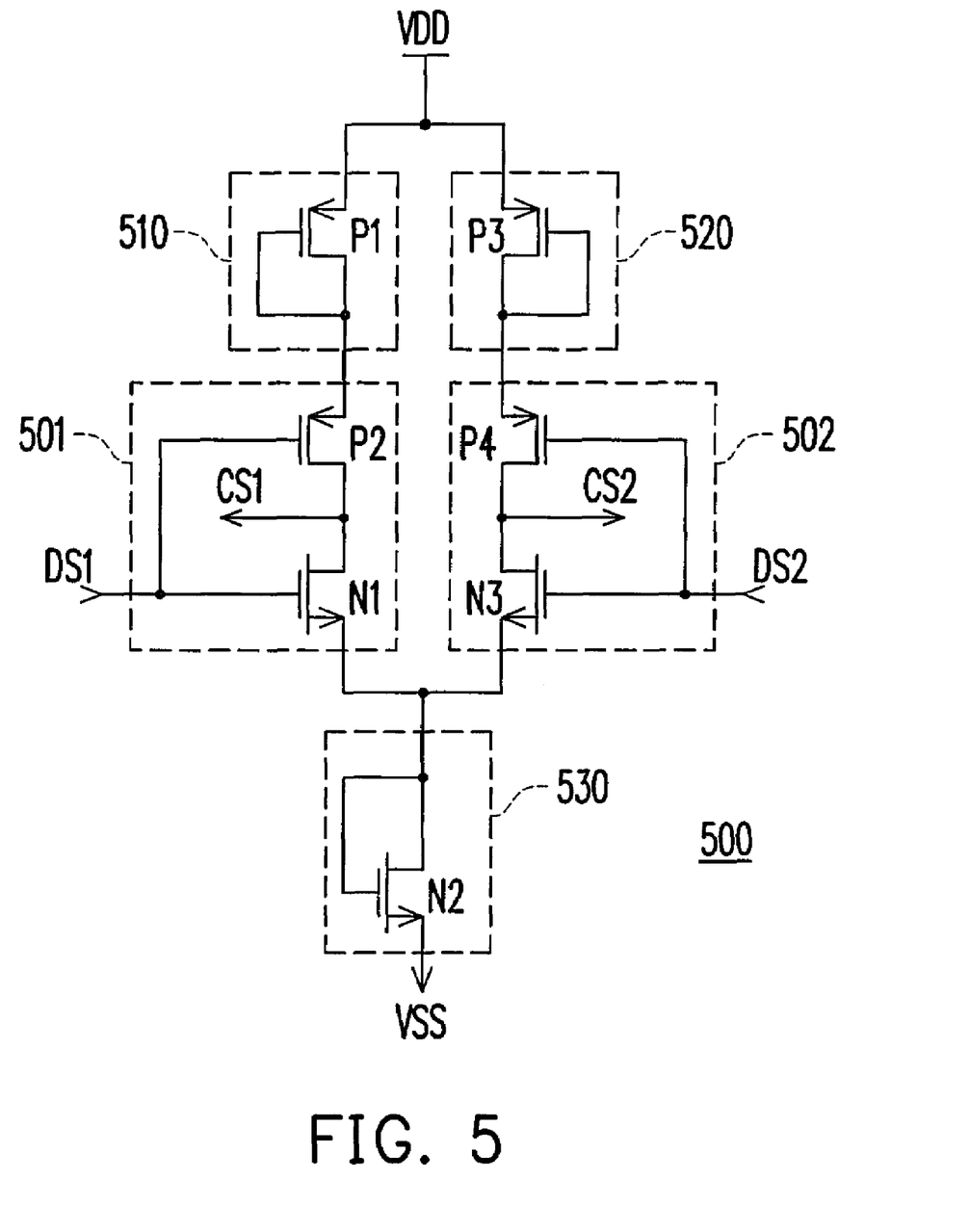
FIG. 5 is a schematic circuit diagram of a driving unit according to the embodiment of FIG. 4A.

FIG. 5 is a schematic circuit diagram of a driving unit of the switching system shown in FIG. 4A. The driving unit 500 includes a first level-adjusting circuit 510, a second level-adjusting circuit 520, a third level-adjusting circuit 530, a first driving circuit 501 and a second driving circuit 502. The first level-adjusting circuit 510 outputs a first control signal CS1 according to the digital signal DS1. The second level-adjusting circuit 520 outputs a second control signal CS2 according to the digital signal DS2. The driving unit 500 is operated between the voltages VDD and VSS, while the first level-adjusting circuit 510, the second level-adjusting circuit 520 and the third level-adjusting circuit 530 are used to adjust the operation voltage biases of the first driving circuit 501 and the second driving circuit 502 so as to restrict the output voltage biases of the first control signal CS1 and the second control signal CS2.

The first level-adjusting circuit 510, the second level-adjusting circuit 520 and the third level-adjusting circuit 530 can be respectively formed by PMOS transistors or NMOS transistors, while the first driving circuit 501 and the second driving circuit 502 can be respectively formed by a combination of PMOS transistors and NMOS transistors.

The circuit architecture detail of the driving unit is described with reference to FIG. 5 as follows. In FIG. 5, the PMOS transistors P1-P4 are P-type transistors, and the NMOS transistors N1-N3 are N-type transistors. The PMOS transistor P1 is coupled between the voltage VDD and the PMOS transistor P2. The common node of the PMOS transistor P1 and the PMOS transistor P2 is coupled to the gate of the PMOS transistor P1 to form the first level-adjusting circuit 510. The NMOS transistor N1 is coupled between another terminal of the PMOS transistor P2 and the NMOS transistor N2, and the common node of the NMOS transistor N1 and the NMOS transistor N2 is coupled to the gate of the NMOS transistor N2. The PMOS transistor P2 and the NMOS transistor N1 together form the first driving circuit 501.

The PMOS transistor P3 is coupled between the voltage VDD and the PMOS transistor P4 to form the second level-adjusting circuit 520. The common node of the PMOS transistor P3 and the PMOS transistor P4 is coupled to the gate of the PMOS transistor P3. The NMOS transistor N3 is coupled between another terminal of the PMOS transistor P4 and the NMOS transistor N2, and the common node of the NMOS transistor N3 and the NMOS transistor N2 are coupled to the gate of the NMOS transistor N2. Another terminal of the NMOS transistor N2 is coupled to the voltage VSS. The PMOS transistor P4 and the NMOS transistor N3 together form the second driving circuit 502, while the NMOS transistor N2 forms the third level-adjusting circuit 530.

The gates of the PMOS transistor P2 and the NMOS transistor N1 are coupled to the digital signal DS1, and gates of the PMOS transistor P4 and the NMOS transistor N3 are coupled to the digital signal DS2. The common node of the PMOS transistor P2 and the NMOS transistor N1 is coupled to the first control signal CS1, and the common node of the PMOS transistor P4 and the NMOS transistor N3 output the second control signal CS2. In the present embodiment, since the switching system 400 usually outputs the signal SG1 or the signal SG2 from one of the output terminals OUT1 and OUT2, the digital signal DS1 and the digital signal DS2 respectively have a logic level phase-inverted to each other. The first control signal CS1 and the second control signal CS2 are respectively phase-inverted to the digital signal DS1 and the digital signal DS2.

In the present embodiment, if the logic-high levels of the digital signals DS1 and DS2 are equal to the voltage VDD and the logic-low levels thereof are equal to the voltage VSS, the logic-high level of the first control signal CS1 would be less than the difference between the voltage VDD and the threshold voltage of the PMOS transistor PI, while the logic-low level thereof would be equal to the voltage VSS plus the threshold voltage of the PMOS transistor P3. Besides, the logic-high level of the second control signal CS2 would be equal to the voltage VDD minus the threshold voltage of the PMOS transistor P3, while the logic-low level thereof would be equal to the voltage VSS plus the threshold voltage of the NMOS transistor N2. In other words, the first control signal CS1 and the second control signal CS2 respectively correspond to the logic levels of the digital signal DS1 and the digital signal DS2, but the voltage swing thereof is less than the voltage swing of the digital signal DS1 and the digital signal DS2.

The present invention uses control signals with a smaller voltage swing to control the switches for reducing the noise produced by the switches during switching and reducing the noise influence caused by the glitch interference and the clock feedthrough interference on the output signals of the switching system. In addition, the driving unit and the switching system can be operated under a same voltage, and the driving unit converts the digital signals into the control signals with a smaller voltage swing so as to reduce the voltage surge of the output signal and accordingly the design complexity of the switching system.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A switching system, comprising:
a first switch, for conducting a first signal according to a first control signal;
a second switch, for conducting a second signal according to a second control signal; and
a driving unit, for receiving a third signal and a fourth signal, wherein the driving unit respectively produces the first control signal and the second control signal according to the third signal and the fourth signal, and the driving unit further comprises:
a third switch;
a fourth switch, wherein the third switch and the fourth switch are operated between a first voltage and a second voltage, and a voltage level of an output terminal of the third switch is determined by the third signal;
a fifth switch;

a sixth switch, wherein the fifth switch and the sixth switch are operated between the first voltage and the second voltage, and a voltage level of an output terminal of the fifth switch is determined by the fourth signal; and a first level-adjusting circuit, disposed on a first path, wherein the third switch and the fifth switch are on the first path and the first level-adjusting circuit adjusts input voltage levels of the third switch and the fifth switch, wherein voltages of the first control signal and the second control signal are restricted within a first voltage interval so as to reduce a noise produced during switching of the first and second switches.

2. The switching system according to claim 1, further comprising:

a current source, for providing the first signal and the second signal by means of shunting.

3. The switching system according to claim 1, wherein the switching system is operated within a second voltage interval wherein the first voltage interval is defined according to the second voltage interval.

4. The switching system according to claim 3, wherein the first voltage interval is equal to the second voltage interval.

5. The switching system according to claim 3, wherein the first voltage interval falls into the second voltage interval.

6. The switching system according to claim 1, wherein the driving unit is operated within a voltage interval which is equal to the first voltage interval.

7. The switching system according to claim 1, wherein the driving unit is operated within a second voltage interval wherein the second voltage interval fall outside the first voltage interval.

8. The switching system according to claim 1, wherein the third signal and the fourth signal are digital signals.

9. The switching system according to claim 1, wherein the driving unit further comprises:

a second level-adjusting circuit, disposed on a second path wherein the fourth switch and the sixth switch are on the second path and the first level-adjusting circuit adjusts input voltage levels of the fourth switch and the sixth switch.

10. The switching system according to claim 9, wherein the driving unit further comprises:

a third level-adjusting circuit, coupled to the second voltage to adjust input voltage levels of the fourth switch and the sixth switch.

11. The switching system according to claim 1, wherein the first level-adjusting circuit is a P-type transistor, the gate of the P-type transistor is coupled to the drain of the P-type transistor, the second level-adjusting circuit is an N-type transistor, and the gate of the N-type transistor is coupled to the drain of the N-type transistor.

12. The switching system according to claim 9, wherein the second level-adjusting circuit is a P-type transistor, the gate of the P-type transistor is coupled to the drain of the P-type transistor.

13. The switching system according to claim 10, wherein the first level-adjusting circuit and the second level-adjusting circuit are P-type transistors, the gates of the P-type transistors are respectively coupled to the drains of the P-type transistors, the third level-adjusting circuit is an N-type transistor, and the gate of the N-type transistor is coupled to the drain of the N-type transistor.

14. The switching system according to claim 1, wherein the first switch and the second switch are N-type transistors or P-type transistors.

15. The switching system according to claim 1, wherein both the third switch and the fifth switch are P-type transistors, and the fourth switch and the sixth switch are N-type transistors.

16. The switching system according to claim 1, wherein the switching System is applied to a digital to analog converter.

17. The switching system according to claim 1, wherein the first control signal and the second control signal are phase-inversed to each other.

18. The switching system according to claim 1, wherein the switching system and the driving unit are biased within a second voltage interval.

19. The switching system according to claim 16, further comprising:

a current source, for providing the first signal and the second signal by means of shunting.

* * * * *

UNITED STATES PATENT AND TRADEMARK OFFICE
CERTIFICATE OF CORRECTION

| | | |
|---|---|---|
| PATENT NO. | : 7,486,103 B2 | Page 1 of 1 |
| APPLICATION NO. | : 11/734423 | |
| DATED | : February 3, 2009 | |
| INVENTOR(S) | : Shian-Sung Shiu et al. | |

It is certified that error appears in the above-identified patent and that said Letters Patent is hereby corrected as shown below:

On the Title page of the patent grant, please replace item (73) Assignee's name from "Young lighting Technology corporation" to --Beyond Innovation Technology Co., Ltd.--

Signed and Sealed this

Fourteenth Day of April, 2009

JOHN DOLL
*Acting Director of the United States Patent and Trademark Office*